United States Patent [19]

Abt

[11] 4,207,526

[45] Jun. 10, 1980

[54] PRE-PROCESSING APPARATUS FOR FM STEREO OVERSHOOT ELIMINATION

[75] Inventor: Richard F. Abt, Pittsburgh, Pa.

[73] Assignee: RCA Corporation, New York, N.Y.

[21] Appl. No.: 970,820

[22] Filed: Dec. 18, 1978

[30] Foreign Application Priority Data

Apr. 5, 1978 [GB] United Kingdom .............. 13369/78

[51] Int. Cl.² ............................................ H04B 1/04
[52] U.S. Cl. .................................. 455/110; 179/1 P; 332/18; 455/43
[58] Field of Search ................... 325/45, 46, 145, 147, 325/187; 332/16, 18, 19; 179/1 P, 1 VL

[56] References Cited

U.S. PATENT DOCUMENTS

| 3,109,991 | 11/1963 | Ocko ...................................... 325/46 |
| 3,529,244 | 9/1970 | Torick et al. .......................... 325/147 |
| 3,815,040 | 6/1974 | Seidel ..................................... 332/18 |
| 4,110,692 | 8/1978 | Pradal ................................... 325/147 |

OTHER PUBLICATIONS

"Combining High Signal Quality with High Modulation Levels in FM"—Eric Small et al., Oct. 1975—Broadcast Management/Engineering, p. 44.
"A New Filtering Process for Optimal Overshoot Control"—D. L. Hershberger, Harris Corp. Engineering Report.

Primary Examiner—Marc E. Bookbinder
Attorney, Agent, or Firm—Eugene M. Whitacre; Paul J. Rasmussen; Robert L. Troike

[57] ABSTRACT

An audio waveform is modified before being applied to a typical FM stereo generator having a low-pass filter which normally produces ringing in response to a clipped signal by pre-emphasizing the audio and reducing the level of that pre-emphasized audio when reaching the maximum allowable modulating signal level. This pre-emphasized audio level is reduced by an amount determined by the ringing in the low-pass filter in the stereo generator to follow.

4 Claims, 6 Drawing Figures

PRE-PROCESSING APPARATUS FOR FM STEREO OVERSHOOT ELIMINATION

BACKGROUND OF THE INVENTION

The subject invention relates to a pre-processing apparatus for optimum overshoot control of an FM stereo system.

FM stereo radio broadcasting is a highly competitive medium. The need for loudness in FM has evolved as a result of this competitiveness and because FM is being used for broader markets such as country western, hard and soft rock, and other up-beat musical formats. Many FM stations are competing directly with AM stations and have developed a need for loudness.

An FM broadcaster must deal with modulation that is not only amplitude sensitive but frequency dependent as well. The maximum permissible deviation (100% modulation) is established by the FCC (Federal Communications Commission) as ±75 KHz. Further the FM transmitter includes a high frequency pre-emphasis network which has been standardized in the United States as one having time constant of 75 microseconds. This pre-emphasis is such that a greater deviation at the higher frequencies is produced so as to overcome the noise rejection characteristics of the FM system which decreases at the higher frequencies. An FM receiver for use in the United States includes a 75 microsecond de-emphasis network. The standard 75 microsecond pre-emphasis presents a frequency dependent limit imposed by the severe high frequency boost given the audio signal. To prevent overmodulation or "overshoot" (exceeding ±75 KHz) FM limiters or clipping circuits have been utilized. Two basic approaches to the elimination of overmodulation caused by the 75 microsecond pre-emphasis have been used. One approach is a selective attenuation of the high frequency program content based upon the amount of energy present in these higher frequencies. In other words, the bandwidth of the audio is dynamically rolled off in direct proportion to the high frequency signal level. As the high frequency energy content increases, high frequency roll off occurs and levels at 100% modulation level. The frequency response is the inverse of the 75 microsecond pre-emphasis curve. This is an effective way of controlling overmodulation, but is obviously at the detriment of the response quality. A second approach is clipping. Implementing this concept requires only pre-emphasizing the audio and hard clipping at all the peaks at 100% modulation. Harmonic distortion generated by this process is attenuated by the subsequent de-emphasis in the receiver and potential out-of-band radiation is suppressed by the low-pass audio filters. Although this second approach has met with a greater acceptance, overshoots still occur. One of the primary reasons for this overshoot, despite the FM limiter or clipper, is due to the low-pass in the stereo generators. All stereo generators employ low-pass filters to basically do the following: 1. prevent interference with the 19 KHz pilot; 2. limit aliasing distortion caused by high frequencies in the L+R channel leading into the upper or lower L−R sideband; 3. eliminate out-of-band spurious emission; and 4. reduce crosstalk in the stereo in SCA subcarrier. To accomplish these tasks, while maintaining a flat audio bandwidth to 15 KHz, rather sophisticated filters are employed. Some of these low-pass filters utilize transition rates in the area of 100 db per octave or more and are typically 40 to 50 db down at 19 KHz. Such filters most often exhibit a large non-linear phase shift which results in filter overshoots and ringing when clipped audio (approaching square wave excitation) is applied. These amplitude overshoots can be very severe and are caused by the non-linear phase shift allowing amplitudes of various frequencies to add in phase with resulting overshoot and by the so-called "Gibbs phenomenon". The non-linear phase shift can be corrected by an all pass filter that has an inverse phase of that in the stereo generator low-pass filter so that when combined in series, the resultant phase is linear. The "Gibbs phenomenon" effect is inherent in all filters and occurs when a complex wave (for example, a squared-off audio peak) is low-pass filtered and the harmonics lost. Some subtractive harmonics are lost (due to filtering), permitting larger amplitude peaks to be present after filtering than were present before filtering. By resorting to a complex non-linear filter where the resulting overshoots are subtracted from the waveform, a single filter stage may be designed to limit drastic amplitude overshoots. However, an FM exciter may include many band-limited stages or even other low-pass filters in the signal chain. In an effort to deal realistically with the FM overshoot problem, it is recognized that amplitude overshoot doesn't occur only in the input audio low-pass filter circuit but rather is an anomaly that is distributed throughout the FM stereo generator/exciter system. To provide a universal solution to the problem the cure must be made external to the FM exciter/stereo generator. This will interest a cost-conscious FM station manager since this does not involve scrapping a presently working and reliable FM exciter/stereo generator system.

SUMMARY OF THE INVENTION

Briefly, an audio processor for modifying an audio waveform to be applied to an FM broadcast transmitter of the type including a low-pass filter at the input thereof is provided. The audio processor includes means for pre-emphasizing the audio input signals to provide less attenuation at the higher frequencies and means responsive to the input signal limit reaching a level which would cause over 100% modulation for reducing that level by an amount determined by the ringing of that signal in the low-pass filter in the broadcast transmitter and means coupled to said reducing means for de-emphasizing the high frequency components to present essentially overall flat frequency response to the broadcast transmitter.

DESCRIPTION OF THE INVENTION

Figure 1:
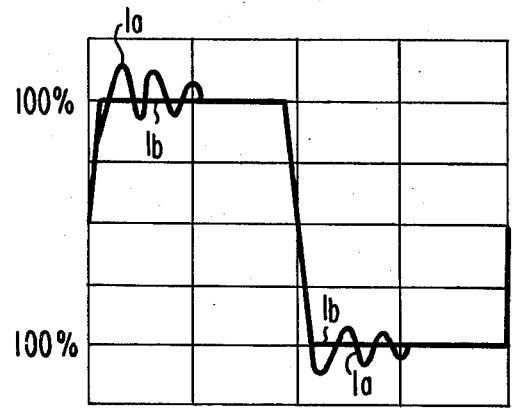
FIG. 1 illustrates the response of a typical low-pass filter in an FM transmitter.

FIG. 1 shows the ringing output (waveform 1a) from a conventional 15 KHz low-pass filter in a stereo generator of an FM transmitter with a square wave excitation (waveform 1b). In the FM exciter, this filter may be a series of distributed low-pass filters within the exciter, each with a different cutoff rate or cutoff frequency. It is then necessary to modify the type of control circuitry that produces these square-top audio waveforms (i.e., the peak clipper) to one that retains the beneficial nature of peak clipping (i.e., clean undistorted audio with full frequency response) yet not produce "overshoot" or over 100% modulation (more than ±75 KHz deviation). Also the processor apparatus should not affect the signal in any manner with modulation levels of less than 100%. As a further requirement, the processor apparatus should be able to operate with any signal conditioning ahead of it (AGC, peak limiting, etc.) and any type of FM exciter system behind it. The audio processor apparatus described herein is operated between any audio gain controlling stage such as an AGC or peak limiter and the input to the FM stereo generator. The audio processor apparatus described herein utilizes a form of shaped bi-level clipping to precisely control and maintain the high frequency peaks. These shaped peaks will produce a low-pass filtered response that exhibits ringing. However the ringing will initiate at 100% modulation and decay to a value always less than 100% for the duration of the peak overdrive.

Figure 3:
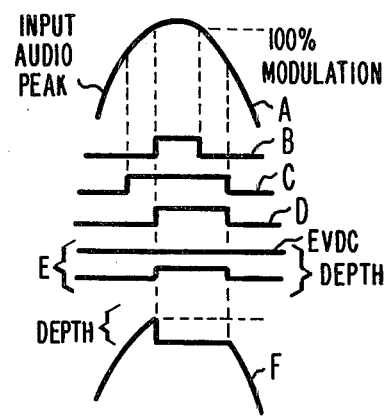
FIG. 3 illustrates the waveforms associated with the apparatus of FIG. 2.
Figure 4:
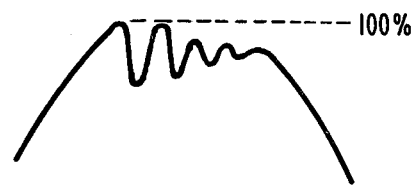
FIG. 4 illustrates the waveform out of the low-pass filter in the transmitter.
Figure 2:
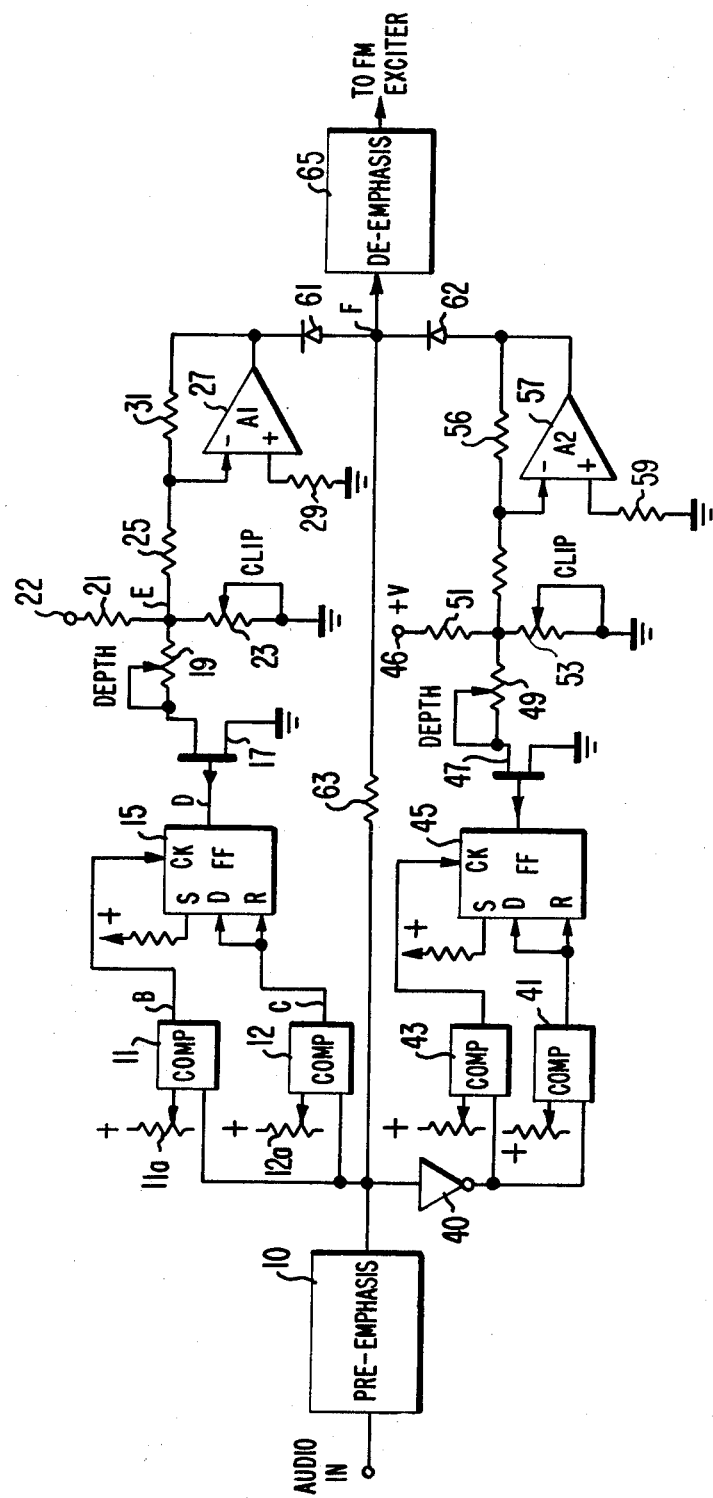
FIG. 2 illustrates the pre-processing apparatus according to one embodiment of the present invention.

Referring to FIG. 2, the audio input undergoes the pre-emphasis in circuit 10. The pre-emphasis is identical with the 75 microsecond pre-emphasis in the stereo generator portion of the FM broadcast transmitter to follow to provide less attenuation at the higher frequencies. The audio signal from the pre-emphasis 10 is applied to a bi-level clipper including comparators 11, 12, 41 and 43, D-type flip-flops 15 and 45, FET transistors 17 and 47, potentiometers 19, 49, 23, and 53, operational amplifiers 27 and 57, diodes 61 and 62 and resistors 21, 25, 56, 51, 29, 59, and 63. The audio signal from the pre-emphasis 10 is applied to comparators 11 and 12 on the positive half cycle and comparators 41 and 43 via inverter 40 on the negative half cycle. Unless the pre-emphasis signal exceeds the 100% modulation level, the output is coupled via resistor 63 to de-emphasis circuit 65. The output from the de-emphasis circuit 65 would be applied to a typical FM stereo generator/exciter which would include the low-pass filter mentioned in the background to prevent the interference with the 19 KHz pilot, to limit the aliasing distortion caused by the high frequency L+R channel leaking into the upper or lower L−R sideband, to eliminate out-of-band spurious emissions and to reduce crosstalk in the stereo and SCA subcarriers. The positive half cycle is indicated for example as waveform A of FIG. 3. The threshold level of comparator 12 is lower than the threshold level of comparator 11. This may be established as indicated by a setting of the potentiometer 12a associated with comparator 12 and potentiometer 11a associated with comparator 11, these potentiometers being coupled to a D.C. source. The reference level at comparator 12 is set by potentiometer 12a to signal the end of bi-level clipping of a single peak. This occurs when the peak signal amplitude drops lower than the peak amplitude of the low-pass filter ringing. If, for example, the ringing in the low-pass filter at the transmitter to follow has a maximum amplitude of 18% of the original amplitude, then potentiometer 12a of this pre-processing apparatus is set 18% lower than potentiometer 11a. When the audio input peak reaches the level at comparator 12, set by potentiometer 12a, an output pulse as indicated by a waveform C is provided. If that audio peak signal continues to the 100% modulation peak level which is set at potentiometer 11a, comparator 11 produces output as indicated by waveform B in FIG. 3. The waveform B from comparator 11 is applied to the clock input and the waveform C from comparator 12 is applied to the D and R inputs of a D-type flip-flop 15. The output waveform from the D-type flip-flop 15 is as illustrated in waveform D of FIG. 3. When the input signal exceeds the level set by potentiometer 12a at comparator 12, the flip-flop 15 is set with the value at the D input terminal of the flip-flop and awaits the clocking pulse from the output from comparator 11 indicating 100% modulation level to trigger an output from the D-type flip-flop 15. The D-type flip-flop 15 remains in the high level state even though the clocking pulse has been removed from comparator 11 until the output from comparator 12 drops to the low value, signalling an end to the peak processing and allowing linear operation. The output from the D-type flip-flop is applied for example to a FET-type transistor 17. The source electrode of FET-type transistor 17 is coupled to ground or reference potential and the drain electrode is coupled through a control potentiometer 19 and resistor 21 to a source of potential at terminal 22. Resistor 21 together with resistor 23 form a voltage divider network. Resistor 23 is a control potentiometer. The junction point of the resistor divider 21 and 23 is coupled via resistor 25 to the inverting input of an operational amplifier 27. The non-inverting input of the amplifier is coupled through a resistor 29 to ground or reference potential. The operational amplifier 27 includes the conventional feedback resistor 31 between the output and inverting input. The positive clipping point (at point F) is set by the resistive potentiometer 23. The operational amplifier 27 will clip the audio positive peak (via diode 61) at a level set by this control potentiometer 23. This level may be reduced to a lower level by the setting of potentiometer 19. The resultant waveform at point F is represented by waveform F in FIG. 3. At the point where the audio waveform reaches 100% modulation level as indicated by an output from comparator 11, the audio is reduced for a length of time controlled by comparator 12 and at a depth controlled by potentiometer 19 which acts as a shunt across point E reducing the D.C. bias set by potentiometer 23. A Fourier analysis predicts that the waveform F of FIG. 3 when placed through the low-pass filter will produce its first period of ringing in a downward direction as indicated in FIG. 4 by adjusting the clip control of potentiometer 23 so that the first positive period of ringing is at the 100% modulation level and the depth of that control by potentiometer 19 (for a duration controlled by comparator 12) is sufficiently large. The 100% modulation point will not be exceeded. This depth control setting can be made to compensate for ringing not only in the 19 KHz low-pass audio filter of the stereo generator but for other circuits and filters that ring when a square wave input is fed to them.

An identical process takes place in the negative peak processing where the input signal is coupled through an inverter 40 to comparators 41 and 43 which operate like comparators 12 and 11 respectively. D-type flip-flop 45 operates as flip-flop 15. The drain of field effect transistor (FET) 47 is coupled through the depth control potentiometer 49 to voltage supply terminal 46 via resistor 51 and the source is to ground. The voltage divider control to the input of operational amplifier 57 is provided by resistor 51 and clipping level potentiometer 53.

The operational amplifier 57 has its non-inverting input coupled to ground via resistor 59. The operational amplifier 57 includes the feedback resistor 56 between the output and inverting input. The operation on the negative peak is identical with that described above in connection with the positive peaks. Isolation of the positive and negative peak circuits is provided by diodes 61 and 62. Flatness of clipping is determined by the divider ratio of resistor 63 against either the positive or negative clamp reference voltage provided by operational amplifiers 27 and 57 respectively through diodes 61 and 62 respectively. The depth control duration is provided by resistive potentiometers 19 and 49 and by comparators 12 and 41 and the 100% modulation clipping point is set by the potentiometers 23 and 53. In accordance with the system until the input signal exceeds the 100% modulation level, the clipping circuits are removed from the system and the signals are applied via resistor 63 to the de-emphasis circuit 65. The de-emphasis circuit at the output of the bi-level clipper 65 attenuates the higher frequencies (75 μsec de-emphasis) so that the overall pre-processing apparatus shown in FIG. 1 has a flat frequency response. The pre-emphasis for the transmitter is accomplished within the transmitter itself to follow. The pre-emphasis in the clipper system is to simulate that which is to take place in the transmitter to follow and to correct it for overmodulation effects.

Figure 5:
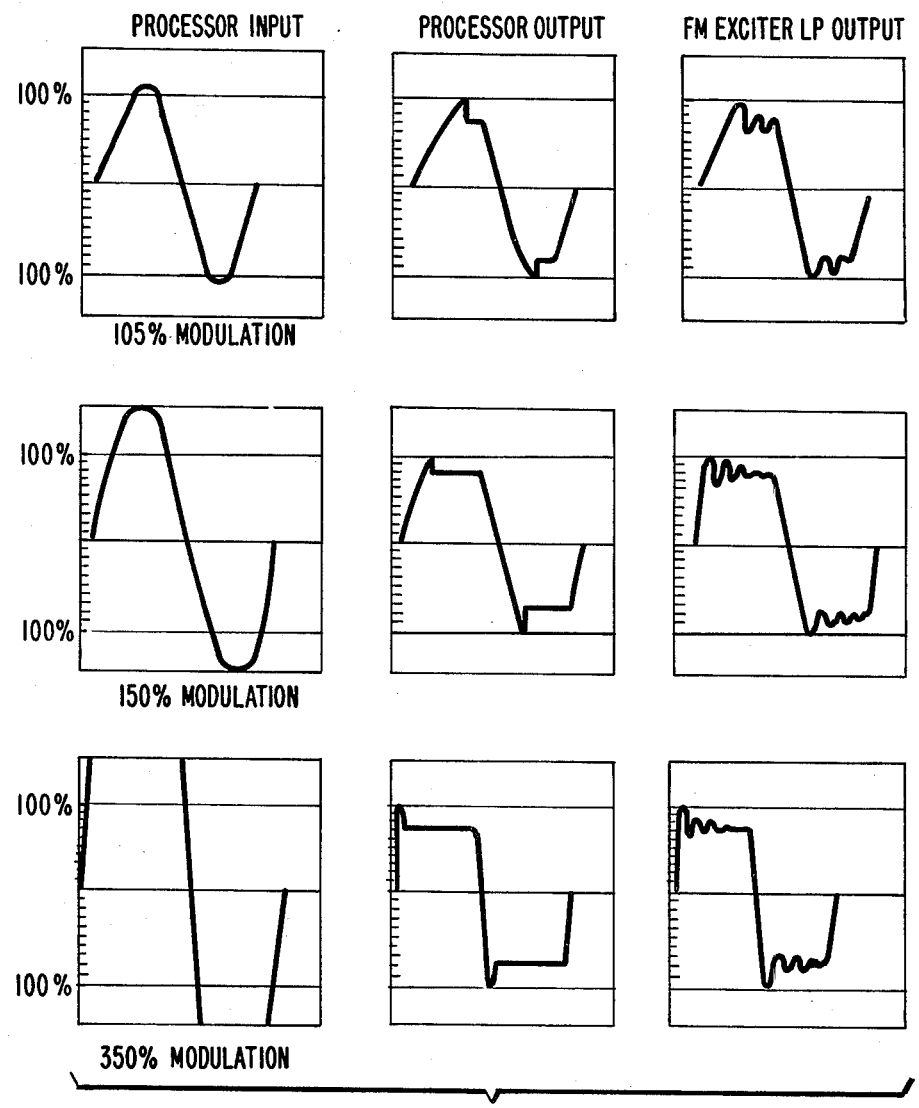
FIG. 5 illustrates the operation of the processor.

FIG. 5 illustrates the operation of the processor. With a signal that would result in a 5% overmodulation, the process allows the peak energy to reach 100% modulation. A D.C. voltage is subtracted from this signal as described above via the depth control provided by potentiometers 19 and 49 and comparators 12 and 41 and lasting for the duration of the peak overload. As the overload amplitude drops below the 100% modulation level, the processor instantly disconnects itself from the signal path. The illustration at the extreme right shows the output of a typical 15 KHz low-pass filter or series of low-pass filters making up the exciter audio chain of the transmitter to follow. As the percentage of peak overdrive increases (as illustrated by the second series of waveforms) the aperture time is increased to accommodate the longer overload duration. As the input overload now forces the audio into almost a perfect square wave, the processor produces an aperture width of almost 180° electrical degrees. Notice that the exciter system response always achieves 100% modulation during the initial wavefront risetime thus preserving the percussive attack of the music and eliminating transient distortion. Since every FM exciter system will have different low-pass filters and distributed phase delay, the depth of the gated aperture will be different for each one. This is a simple matter for the processor since this "customizing" can be easily dialed-in by a front panel control to the potentiometers 19 and 49 and comparators 12 and 41.

The problem that has existed with all clipping-type peak controllers and one that has been left unanswered is that of D.C. restoration. Now that the low-pass filter ringing problem is under control and the peak amplitudes are tightly held to 100% modulation consider one last system. Somewhere in the exciter, the audio signal which has been controlled by the processor or any other type peak clipper for that matter, must be A.C. coupled. Whether it be a simple audio input buffer, pre-emphasis amplifier, or the 15 KHz low-pass filter the audio line will eventually run into a D.C. blocking capacitor. Consider a slightly asymmetrical audio signal waveform that is clipped according to the above process (or standard peak clipping). When this is capacitively coupled, the capacitor will try to redistribute the energy above and below zero volts equally. For the case where positive energy is clipped off, this D.C. blocking capacitor responds by shifting the entire signal slightly positive to re-establish equal area energy. The tightly held 100% peak is now overmodulating ("overshooting"). The condition is largely left unanswered by previous peak clipping circuits since D.C. restoration usually involves a feed forward signal to inject the proper polarity D.C. correction at the last A.C. coupled stage. The circuit shown in FIG. 6 accomplishes the effect of D.C. restoration on the peak level of an asymmetrical capacitively coupled signal on a predictive basis.

Figure 6:
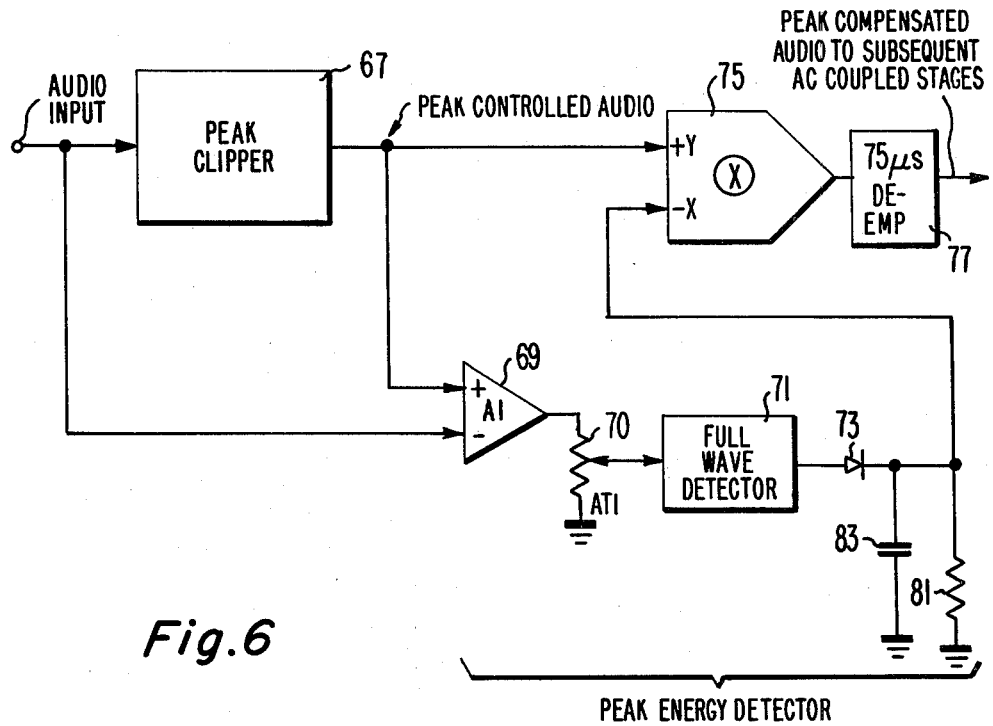
FIG. 6 illustrates the processor apparatus and a circuit for D.C. restoration.

Referring to FIG. 6, a system is shown which accomplishes the effect of D.C. restoration on the peak of asymmetrical coupled signal. The program material (audio) after the pre-emphasis is applied to the bi-level clipper system 67 which is like that described in connection with FIG. 2 between the pre-emphasis 10 and the de-emphasis 65. The output is a tightly peak amplitude controlled signal. This peak amplitude control output is compared with the input audio to the clipper system 67 (audio from the pre-emphasis 10) at a difference amplifier 69. The output of this amplifier indicates the asymmetry and is equal to the amount of peak energy lost due to peak clipping. The energy is full wave detected with the negative going signal inverted to provide an absolute value signal at the output of detector 71. The absolute value signal from detector 71 is a positive level signal indicative of the + or − level signal peaks above and below the clipping level. This absolute value signal is applied to a peak detector circuit 73 which generates a resultant D.C. signal. This D.C. signal level is applied via the time constant circuit of resistor 81 and capacitor 83 to modulate the peak controlled audio in a quadrant multiplier 75. The quadrant multiplier may be for example a 4-quadrant multiplier with the signal from the bi-level clipper 67, coupled to the +Y input and the signal from the detector 71 applied to the −X input. As the detached signal rises and falls the gain is reduced and increased respectively in proportion to the peak energy lost due to clipping. By reducing the gain sufficiently (in proportion to the peak energy lost due to clipping) in the multiplier whenever asymmetrical clipping occurs, the D.C. shift in the subsequent stages will not be enough to allow the peaks to exceed the established 100% value. A variable potentiometer 70 at the input of detector 71 sets the detector 71 for maximum modulation of the peaks to eliminate overmodulation. The release time constant of the resistor 81 and capacitor 83 is set long enough so as not to produce excessive distortion. Since the output from the clipper would equal the input until 100% peak level is reached, this circuit will not reduce the modulation level until the 100% peak level is reached and thereby not introduce objectionable gain pumping. The −Y input of multiplier 75 is coupled to ground and the +X input is coupled to a D.C. bias source.

What is claimed is:

1. An audio processor for modifying an audio modulating signal waveform to be applied to an FM transmitter, said transmitter of the type including a first pre-emphasis means and a low-pass filter in the input thereof which filter normally produces ringing of that signal when the audio is limited or clipped to prevent overmodulation, comprising:

second pre-emphasis means responsive to said audio modulating signal for pre-emphasizing said audio in a manner similar to said first pre-emphasis means, limiting means coupled to said second pre-emphasis means responsive to the audio output signal level therefrom reaching a level which would cause over 100% modulation for reducing that level by an amount determined by the amplitude of ringing of second audio output signal in said low-pass filter to produce a limited audio signal, and de-emphasis means coupled to said limiting means for de-emphasizing said limited audio in a manner inverse to said pre-emphasis means to provide essentially an overall flat frequency response.

2. The combination of claim 1 wherein said limiting means includes first detecting means for detecting the 100% modulation level of said pre-emphasized audio and second detecting means for detecting a pre-emphasized audio level below the 100% modulation level corresponding to the ringing amplitude of said low-pass filter, and means coupled to said first and second detecting means for reducing the audio level of said pre-emphasized audio when such signal over said 100% level is reached by the amount of said ringing until said audio signal falls below the second detected level.

3. The combination of claim 2 wherein said reducing means includes D-type flip-flops clocked by signals from said first detecting means and triggered by signals from said second detecting means.

4. An audio processor for modifying an audio modulating signal waveform to be applied to an FM transmitter, said transmitter of the type including a first pre-emphasis means and a low-pass filter in the input thereof which filter normally produces ringing of that signal when the audio is limited or clipped to prevent overmodulation, comprising:

second pre-emphasis means responsive to said audio modulating signal for pre-emphasizing said audio in a manner similar to said first pre-emphasis means, clipping means coupled to said second pre-emphasis means responsive to the audio output signal level therefrom reaching a level which would cause over 100% modulation for reducing that level by an amount determined by the amplitude of ringing of said audio output signal in said low-pass filter to produce a clipped audio signal, said clipping means producing at times asymmetry in said clipped audio signal such that when said clipped signal is capacitively coupled within the transmitter, a level shift occurs in said clipped signal producing overmodulation, means responsive to said clipped audio signal and said audio signals before clipping for detecting the absolute value of the peak energy lost due to clipping, gain control means coupled to said clipping means and said detecting means for reducing the amplitude level of the clipped audio signals in proportion to the level of the absolute level detected, and de-emphasis means coupled to said gain control means for de-emphasizing said gain controlled, clipped audio in a manner inverse to said second pre-emphasis means to provide essentially an overall flat frequency response.

* * * * *